United States Patent [19]
Hara

[11] Patent Number: 5,302,850
[45] Date of Patent: Apr. 12, 1994

[54] SEMICONDUCTOR SEALING MOLD

[75] Inventor: Akitoshi Hara, Suwa, Japan

[73] Assignee: Seiko Epson Corporation, Tokyo, Japan

[21] Appl. No.: 114,413

[22] Filed: Aug. 30, 1993

Related U.S. Application Data

[60] Continuation of Ser. No. 946,808, Sep. 17, 1992, abandoned, which is a continuation of Ser. No. 757,426, Sep. 10, 1991, abandoned, which is a division of Ser. No. 583,813, Sep. 17, 1990, Pat. No. 5,077,237.

[30] Foreign Application Priority Data

Sep. 18, 1989 [JP] Japan .................. 1-241164

[51] Int. Cl.$^5$ .......................................... H01L 23/28
[52] U.S. Cl. ..................... 257/667; 249/141; 249/160; 264/272.17; 257/787
[58] Field of Search .................... 357/72, 74, 55; 437/215, 216, 217, 218, 219; 264/272.11, 272.17; 249/141, 160; 257/787, 667

[56] References Cited

U.S. PATENT DOCUMENTS

| | | | |
|---|---|---|---|
| 4,043,027 | 8/1977 | Birchler et al. | 29/588 |
| 4,250,347 | 12/1981 | Fierkens | 437/217 |
| 5,018,003 | 5/1991 | Yasunaga et al. | 357/72 |

FOREIGN PATENT DOCUMENTS

| | | |
|---|---|---|
| 510393 | 8/1939 | United Kingdom . |
| 1204619 | 9/1970 | United Kingdom . |
| 2195826 | 4/1988 | United Kingdom . |

Primary Examiner—William Mintel
Assistant Examiner—Roy Potter
Attorney, Agent, or Firm—W. Douglas Carothers, Jr.

[57] ABSTRACT

A semiconductor sealing mold for sealing a semiconductor element within a thermosetting resin is provided with resin inflow openings formed in oppositely and substantially symmetrically opposed relation to the active surface and back surface of a lead frame connected semiconductor element. As a result, the application of the molding process and method of encapsulation of the semiconductor element can be accomplished under conditions of uniformly applied pressure to opposite surfaces of the semiconductor element and extending outwardly in all radial directions from the center of the semiconductor element. Furthermore, since the bonding wires and lead frame leads are substantially aligned in the same radial directions from the center of the semiconductor element, damage does not occur to these wires or leads during the molding process.

3 Claims, 2 Drawing Sheets

SEMICONDUCTOR SEALING MOLD

This is a continuation of copending application Ser. No. 07/946,808 filed Sep. 17, 1992, now abandoned, which is a continuation of copending application Ser. No. 07/757,426 filed Sep. 10, 1991, now abandoned, which is a division of application Ser. No. 07/583,813 filed on Sep. 17, 1990 now U.S. Pat. No. 5,077,237.

BACKGROUND OF THE INVENTION

This invention relates generally to a semiconductor sealing mold and more particularly to a semiconductor sealing mold employed in a method of encapsulating a semiconductor element via a resin sealing process.

FIG. 2A is a plan view of a lead frame connected semiconductor element, and FIG. 2B is a sectional view along the line 2B—2B in FIG. 2A disclosing a semiconductor sealing mold 20 as known in the art. Semiconductor element 8 is secured to lead frame 1 via semiconductor element mount 6, such as, with an adhesive or eutectic alloy. The output pads of semiconductor element 8 and internal leads 2 of lead frame 1 are connected by a plurality of bonding wires 16 comprising fine metal wire, such as, gold or copper-aluminum. Further, a dam bar 3 is formed between internal leads 2 and external leads 4 of lead frame 1. Also, pilot holes 5 and outer frame 7 may be formed external of lead frame 1.

Previously employed semiconductor sealing molds have resin inflow openings 10 formed in a lower mold portion 14 so that they are only in communication with the side wall regions of lower mold cavity 12B. Semiconductor apparatus employed in connection with such semiconductor sealing molds require initial alignment of lead frame 1 between upper mold portion 13 and lower mold portion 14 of the semiconductor sealing mold, followed by heating these mold portions at a temperature between 160° C. to 180° C., and thereafter compressing lead frame 1 between mold portions 13 and 14 at a predetermined pressure. Then, a thermosetting resin having a low viscosity is introduced at resin inflow opening 10 and runner 11 to the interior of the compressed and heated mold portions 13 and 14 to bring about filling of the mold cavity 12. However, since resin inflow opening 10 is provided within the confines of lower mold portion 14 relative to lead frame 1, the thermosetting resin flowing into cavity 12 from resin inflow opening 10 is actually blocked by the presence of lead frame 11 so that lower mold cavity 12B will fill at a faster rate than upper mold cavity portion 12A. In other words, in the encapsulation of semiconductor element 8, the flow of resin in the mold cavity was directed towards semiconductor element from one direction only. In this manner, the resin forced into cavity 12 flows from lower mold cavity 12B into upper mold cavity 12A and, as a result, the force of the resin flow through and about lead frame 1 will shift semiconductor element mount 6 and internal leads 2 toward the upper reaches of upper mold cavity 12A. This approach in mold filling tends to damage semiconductor element 8 and/or its leads. For example, (1) The position of the semiconductor element 8 relative to lead frame 1 is deformed, disarranged or twisted. (2) Internal leads 2 of lead frame 1 are deformed. (3) Adjacently disposed bonded wires are brought into contact causing electrical shorts or the bonded wires are severed or broken. All of these problems result in significant deterioration or destruction of the useful life of the lead frame connected semiconductor element.

The present invention resolves these problems and has as an object of providing a semiconductor sealing mold that avoids or eliminates the foregoing problems.

It is another object of this invention is to provide a semiconductor method of encapsulation of a semiconductor element in resin that presents damage to the semiconductor connections to its lead frame during the sealing or encapsulation process.

It is a further object of this invention to provide means to increase the yield of lead frame connected semiconductor elements subjected to a semiconductor sealing mold process wherein they are encapsulated in a resin material.

It is another object of this invention to provide a semiconductor sealing mold to prevent the occurrence of fundamentally fatal defects in the employment of semiconductor sealing apparatus, such as, a distorted position change of the semiconductor element relative to its lead frame or mount, deformation of the lead frame internal leads, and undesirable electrical contact between adjoining bonding wires or the severing of bonding wires.

SUMMARY OF THE INVENTION

According to this invention, a semiconductor sealing mold for sealing a semiconductor element within a thermosetting resin is provided with resin inflow openings formed in oppositely and substantially symmetrically opposed relation to the active surface and back surface of a lead frame connected semiconductor element. As a result, the application of the molding process and method of encapsulation of the semiconductor element can be accomplished under conditions of uniformly applied pressure to opposite surfaces of the semiconductor element and extending outwardly in all radial directions from the center of the semiconductor element. Furthermore, since the bonding wires and lead frame leads are substantially aligned in the same radial directions from the center of the semiconductor element, damage does not occur to these wires or leads during the molding process. Thus, high yields in finish molded semiconductor products can be achieved with the use of the semiconductor sealing mold of this invention.

The present invention provides for resin inflow openings in the upper mold and lower mold cavity plates of a semiconductor sealing mold in positions that are substantially opposite the semiconductor element aligned in the mold cavity. Because the pressure of the inflow of resin increases substantially in a uniform manner relative to the active surface as well as the back surface of the semiconductor element, as attached to the lead frame, it becomes possible to eliminate vertical fluctuations or vibratory action imposed on the lead frame during the molding process. When, for example, the resin inflow openings are arranged so as to be aligned substantially relative to the center of the semiconductor element, the direction of resin flow and the direction of the bonding wires connecting the semiconductor element with the internal leads of the lead frame and the direction of the arrangement of the internal leads are all approximately in radial conformance from the center of the semiconductor element. As a result, there is a uniform radial application of molding pressure and resultant stress extending in all directions from the center of the mold at the point of introduction of the molten resin sealing material thereby avoiding deformation of the internal leads, or the causing of electrical contact between adjacent bonding wires between the lead frame and semiconductor element, or the undesirable severing of such bonding wires.

Another aspect of this invention is the provision of a method of encapsulating a semiconductor element in resin or sealing it with resin comprising the steps of mounting the semiconductor element in a mold cavity so that an active surface and an opposite back surface of the semiconductor element respectively face oppositely opposed parts of the mold cavity, providing the oppositely opposed mold parts with respective oppositely opposed resin inflow openings for each receiving resin from a source, introducing separate flows of resin from the source into the mold parts via the inflow openings so that both the active surface and the opposite back surface of the semiconductor element are subjected to the pressure of the respective inflow of resin into the mold cavity, and effecting setting of the resin to encapsulate the semiconductor element within the resin or seal the semiconductor element with the resin.

Thus, in the preferred form of this invention, the resin inflow openings in first and second mold cavity plates are, during molding, disposed in substantially oppositely opposed relation with the semiconductor element carried on a lead frame supported therebetween. Because the pressure of the inflowing resin increases nearly uniformly on the active surface side and the back surface side of the semiconductor element, it becomes possible to avoid subjection of the lead frame to vibratory or rapid up and down movement caused by entrance of the resin under pressure from only one side or direction of the mold cavity and/or from a position not central relative to the mold cavity and the centrally positioned lead frame. In particular, when, for example, the resin inflow openings are arranged so that they are substantially aligned with the center of the semiconductor element supported in the mold cavity, the directions of resin flow from the inflow openings, the directions of the bonding wires connecting the semiconductor element to the internal leads of the lead frame, and the directions of the internal leads may all be substantially in radial directions from the center of the semiconductor element so that there is no stress during molding that would deform the internal leads and connected bonding wires thereby avoiding (1) deformation of the internal leads, (2) contact, and therefore shorting, of adjacently disposed, fine connection wires, and (3) severing or cutting of the fine connection wires.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1A:
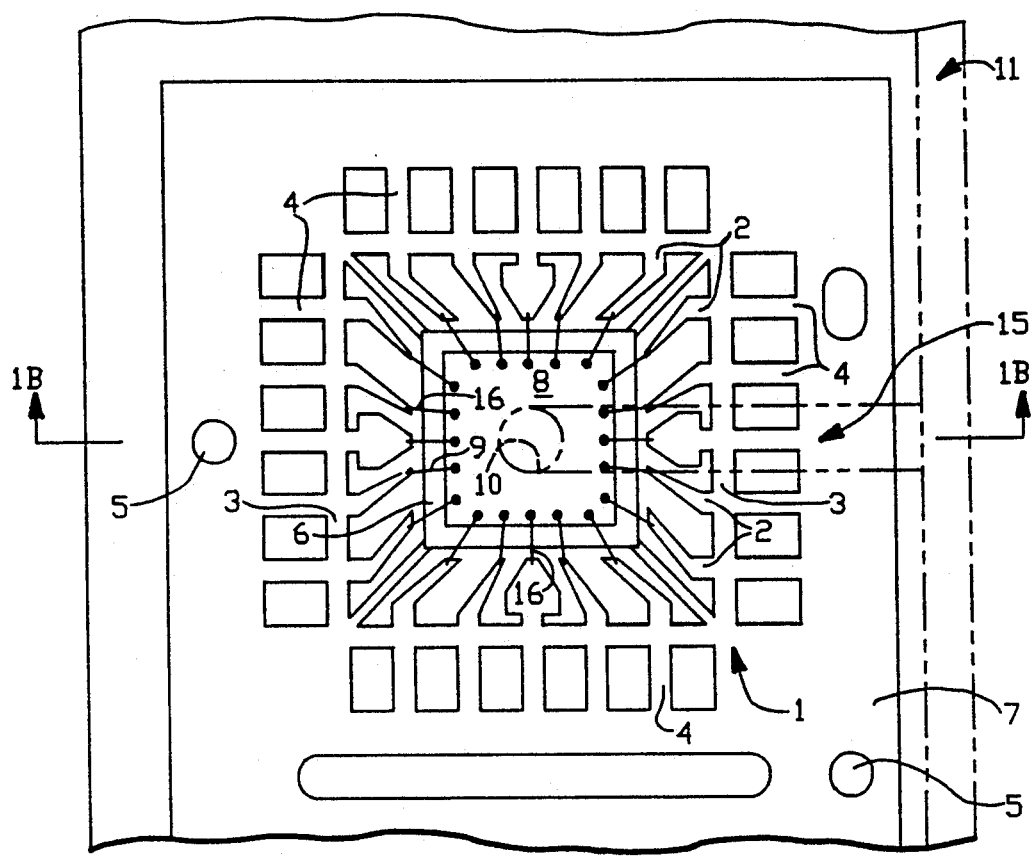
FIG. 1A is a plane view of a lead frame connected semiconductor element ready for the sealing mold process of this invention and illustrates a semiconductor sealing mold employed in this invention.
Figure 1B:
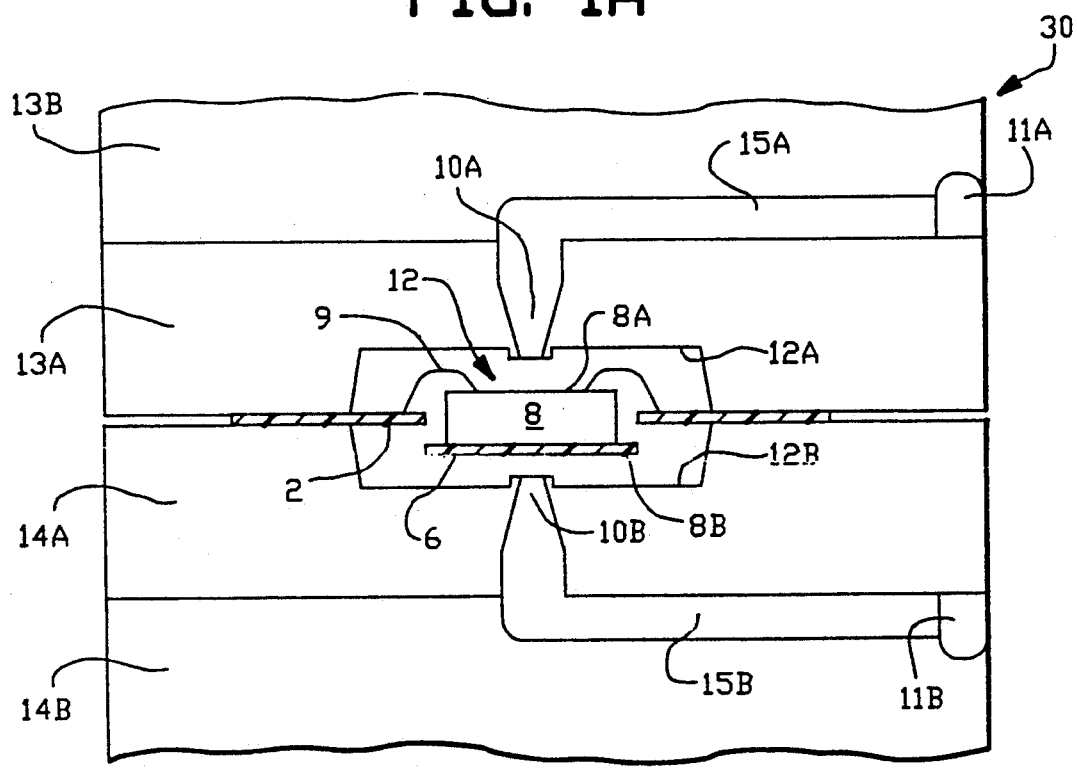
FIG. 1B is a sectional view along the line 1B—1B of FIG. 1A.

Reference is now made to FIGS. 1A and 1B wherein there is shown, respectively, a lead frame connected semiconductor element 8 ready for the sealing mold process and a semiconductor sealing mold 30 comprising this invention. As indicated previously, lead frame 1, with semiconductor element 8 attached onto its semiconductor element mount 6, comprises dam bar 3, external leads 4, pilot holes 5 and outer frame 7. Further, connection pads provided on the active surface of semiconductor element 8 and internal leads 2 of lead frame 1 are connected by bonding wire, such as, made of fine gold wire.

Mold 30 comprises upper mold plate 13B and lower mold plate 14B which are loaded into a molding machine (not shown). Upper mold cavity plate 13A, provided with an upper mold cavity 12A and an upper resin inflow opening 10A, is attached to upper mold plate 13B. Lower mold cavity plate 14A, provided with a lower mold cavity 12B and a lower resin inflow opening 10A, is attached to lower mold plate 14B. Mold cavities 12A and 12B are aligned so that they open into each other when mold plates 13A and 13B are brought together for the molding process. Upper and lower mold resin inflow openings 10A and 10B, respectively, connected to runners 10A and 10B, are arranged to substantially open into the center region of respective mold cavities 12A and 12B. Thus, upper mold resin inflow opening 10A is arranged to be substantially in opposite relation to active surface 8A of semiconductor element 8 and lower mold resin inflow opening 10B is arranged to be substantially in opposite relation to back surface 8B of semiconductor element 8 when element 8 is aligned in mold cavities 12A and 12B prior to mold closure. Lead frame 1 with wire bonded semiconductor element 8 is placed in an aligned position as proscribed by lower mold cavity 12B of mold plate 14A. Thereafter, the mold plates 13A and 14A are brought together in a compressed state and the mold is heated to a temperature, for example, in the range of 160° C. to 180° C.

It should be realized that openings 10A and 10B need not be exactly oppositely opposed or aligned relative to each other, as they need only to be nearly aligned relative to each other and nearly aligned relative to surfaces 8A and 8B upon closure of mold cavities 12A and 12B. Furthermore, the openings provided in each mold cavity 12A and 12B may be positioned radially relative the center of cavity 12 such as at end or corner points of a plus sign, triangle or square, or may be in the form of a circle. Additional openings may provide for uniform application of initial impact of resin introduced into cavity 12 as well as its uniform distribution radially outward from the point of introduction at the inflow openings.

The method of employing the semiconductor sealing mold of this invention relative to molding semiconductor apparatus and the method of encapsulation produced by this method is as follows. First, lower mold cavity plate 14A and lead frame 1 and upper mold cavity plate 13A are loaded at prescribed positions onto lower mold plate 14B, which, in turn, are loaded into the molding machine. Then, the molding machine is operated to bring plates 13A and 14A together and are held together in their compressed state. Upper mold plate 13B and lower mold plate 14B are heated within the temperature range of about 160° C. to 180° C. and are brought together by the molding machine.

Next, a thermosetting resin, extruded by a compression cylinder (not shown) of the molding machine and having low viscosity due to the heating temperature of the semiconductor sealing mold, flows concurrently into both upper mold sub-runner 15A and lower mold sub-runner 15B. The resin then flows respectively from upper mold resin flow opening 10A and lower mold resin inflow opening 10B concurrently into upper and lower mold cavities 12A and 12B. Because upper mold and lower mold resin inflow openings 10A and 10B are comparatively much smaller than upper mold and lower mold sub-runners 15A and 15B, the thermosetting resin from respective upper mold and lower mold resin inflow openings 10A and 10B initially impacts with its greatest force substantially centrally against both active side 8A of semiconductor element 8 and back surface 8B of semiconductor element mount 6 so as to subject the structure to substantially oppositely opposed pressure from both sides thereof. The resin thereafter flows radially outward in all directions within the confines of mold cavity 12 from the initial impact points to completely fill mold cavity 12. At this time, the force and quantity of resin flowing from upper mold resin inflow opening 10A into upper mold cavity 12A is equal to the force and quantity of resin flowing from lower mold resin inflow opening 10B into lower mold cavity 12B. Also, the resin inflow pressure received by semiconductor element 8 at active surface 8A is substantially equal the resin inflow pressure received by semiconductor element 8 at back surface 8B. Accordingly, semiconductor element 8 and semiconductor element mount 6 will not be set into vibratory or oscillatory motion caused by pressure differences present in mold cavity 12 or by nonuniform, unilateral forces on the frame mounted element 8 by the resin flow under pressure.

Upon completion of the injection and filling of mold cavity 12 with the thermosetting resin, the state of the mold cavities 12A and 12B is maintained so that the thermosetting resin will set by the action of the heated mold to encapsulate or seal semiconductor element 8. After the thermosetting resin has set, the mold is depressurized and the compressed state of upper mold plate 13B and lower mold plate 14B is terminated. Next, lower mold plate 14B is shifted downward away from upper mold cavity plate 14A thereby creating a space between upper and lower mold cavity plates 13A and 13B. Then, lower mold cavity plate 14A and lead frame 1 and upper mold cavity plate 13A are shifted laterally relative to lower mold plate 14B to permit easy access to the molded semiconductor lead frame 1. Next, the thermosetting resin which has also set in upper runner 15A is removed from upper mold cavity plate 13A. Further, after removal of upper mold cavity plate 13A, the resin sealed lead frame 1 is removed from lower mold cavity plate 14A and placed into an appropriate product container. Then, the thermosetting resin which has set in lower mold runner 15B is removed from lower mold cavity plate 14A. The above described process constitutes one cycle of operation of the molding process.

Figure 2A:
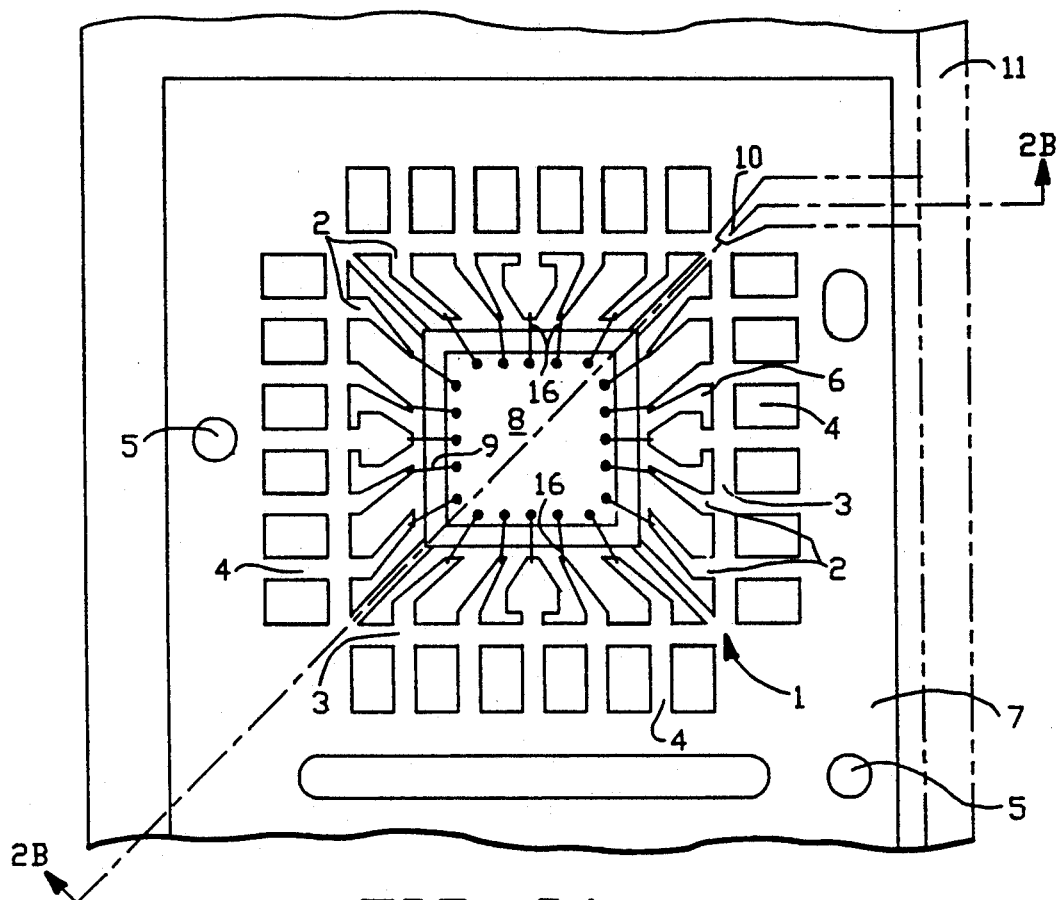
FIG. 2A is a plane view of a lead frame connected semiconductor element ready for the sealing mold process.
Figure 2B:
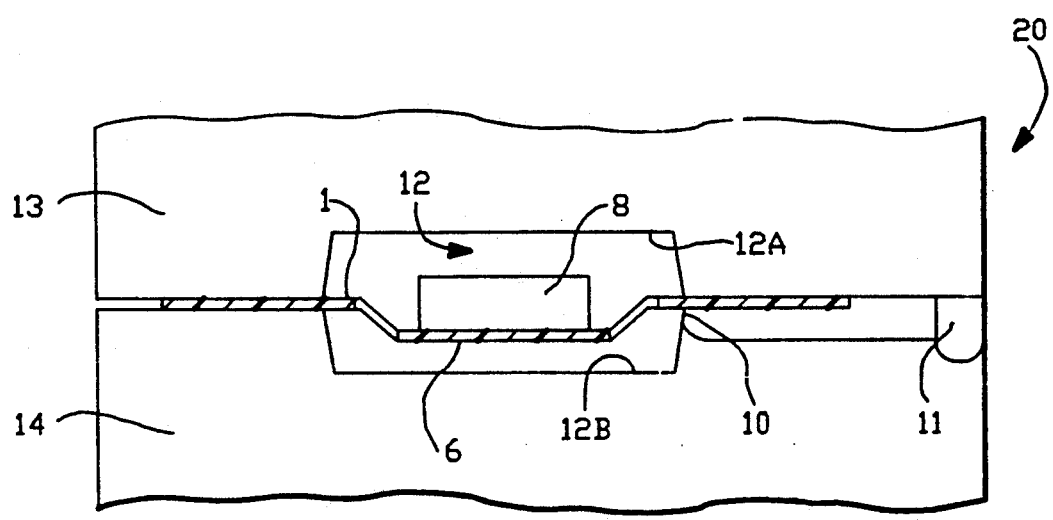
FIG. 2B is a sectional view along the line 2B—2B of FIG. 2A and illustrates a semiconductor sealing mold employed in the prior art.

By enclosing semiconductor element 8 and semiconductor element mount 6 and having the thermosetting resin flow centrally from oppositely opposed directions in the manner illustrated in connection with FIG. 2B, semiconductor element 8 and semiconductor element mount 6 are sealed in a stabilized state without being subjected to vibrational forces or physical fluctuations caused by nonuniform application of molding pressures in the semiconductor sealing mold process.

Because the construction of the sealing mold of this invention is such that resin inflow openings 10A and 10B are mutually opposite active surface 8A and back surface 8B of semiconductor element 8, the pressure of the inflowing resin is applied substantially equally to both frame mounted, semiconductor element surfaces 8A and 8B so that vibrations and other forces imposed upon lead frame 1 are avoided. In addition, when, for example, resin inflow openings 10A and 10B are arranged so as to be positioned substantially central of semiconductor element 8, the radial direction of resin flow is in conformance with the direction of bonding wire connections between frame internal leads 2 and semiconductor element 8 and the direction of the arrangement of internal leads 2 are also substantially in conformance with the radial direction relative to the center of semiconductor element 8. As a result, there is no transverse directional action of force or stress is placed on bonding wires 16 and internal leads 2 that would bring about deformation of wires 16 and leads 2 thereby rendering it possible to provide a semiconductor sealing mold that can avoid the occurrence of the problems of internal lead deformation, contact among adjacent bonding wires, and severance of bonding wires.

While the invention has been described in conjunction with several specific embodiments, it is evident to those skilled in the art that many further alternatives, modifications and variations will be apparent in light of the foregoing description. Thus, the invention described herein is intended to embrace at such alternatives, modifications, applications and variations as fall within the spirit and scope of the appended claims.

What is claimed is:

1. A semiconductor sealing mold useful in sealing a semiconductor element within an encapsulant material while subjecting opposite element surfaces to balanced encapsulant input pressures, comprising:

first and second opposing mold members each having a partial mold cavity and configured for mating engagement providing an enclosed mold cavity employed in sealing a semiconductor element within an encapsulant material;

said semiconductor element mounted on a lead frame;

one of said semiconductor element surfaces comprising an active surface with a plurality of conductive fine leads each with one end attached to said active surface, said leads substantially extending radially outward relative to a center of said active surface each with their other end attached to said lead frame;

an encapsulant input opening in a bottom portion of each of said mold members and connected to receive encapsulant from at least one source, said input openings being centrally located on said mold member bottoms and opposing one another in substantial axial alignment when said mold members are brought together in mating engagement;

said element mounted lead frame held in a fixed position in said enclosed mold cavity between said opposing mold members with said element active surface substantially perpendicular to said input opening axial alignment with said element active surface center substantially positioned along said input opening axial alignment when said mold members are brought together in mating engagement;

each of said input openings configured to introduce encapsulant with balanced encapsulant input pressures which create substantially equal pressure on said opposite surfaces of said semiconductor element during encapsulation so that vibratory and oscillatory motion due to encapsulant input pressure differences is eliminated and outward radial forces of introduced encapsulant substantially conforms with the radial outward extent of said leads for preventing lead deformation or severance.

2. The sealing mold of claim 1 wherein said encapsulant is a thermosetting resin.

3. The sealing mold of claim 1 comprising more than two encapsulant input openings provided in each of said mold members symmetrically positioned relative to said center of said first and second mold members.

* * * * *